US012637761B2

(12) United States Patent
Lee et al.

(10) Patent No.: US 12,637,761 B2
(45) Date of Patent: May 26, 2026

(54) METHOD OF DENSIFYING PLASMA-RESISTANT COATING LAYER

(71) Applicant: Samsung Electronics Co., Ltd., Suwon-si (KR)

(72) Inventors: Naeun Lee, Suwon-si (KR); Shinhwa Jung, Suwon-si (KR); Sanghee Lee, Suwon-si (KR); Wonhee Lee, Suwon-si (KR); Donghyun Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 19/076,124

(22) Filed: Mar. 11, 2025

(65) Prior Publication Data

US 2026/0085405 A1 Mar. 26, 2026

(30) Foreign Application Priority Data

Sep. 23, 2024 (KR) ........................ 10-2024-0128266

(51) Int. Cl.
*C23C 16/30* (2006.01)
*C23C 16/44* (2006.01)
(Continued)

(52) U.S. Cl.
CPC .......... *C23C 16/30* (2013.01); *C23C 16/4412* (2013.01); *C23C 16/483* (2013.01); *C23C 16/56* (2013.01)

(58) Field of Classification Search
CPC ... C23C 16/56; C23C 16/4412; C23C 16/483; C23C 16/48; C23C 16/30; C23C 16/405;
(Continued)

(56) References Cited

U.S. PATENT DOCUMENTS 11,519,071 B2 12/2022 Peng et al.
11,764,037 B2 9/2023 Waldfried
(Continued)

FOREIGN PATENT DOCUMENTS

CN 113522688 A 10/2021
JP 2012-064773 A 3/2012
(Continued)

OTHER PUBLICATIONS

Kim, Minjoong, et al. "The effect of powder particle size on the corrosion behavior of atmospheric plasma spray-Y2O3 coating: Unraveling the corrosion mechanism by fluorine-based plasma." Applied Surface Science 606 (2022): 154958.
(Continued)

*Primary Examiner* — Michael P Wieczorek
(74) *Attorney, Agent, or Firm* — Muir Patent Law, PLLC

(57) ABSTRACT

A method of densifying a plasma-resistant coating layer includes applying a fluorocarbon material including $C_xH_yF_z$ (where x and z are each independently a real number greater than 0, and y is an integer greater than or equal to 0) to a surface of a base material having a surface including $Y_aO_b$ (where a and b are each independently a real number greater than 0) to form a fluorocarbon coated base material, and projecting a pulsed laser beam onto a region of the fluorocarbon coated base material to form a coating layer over the base material, in which coating layer yttrium (Y) and fluorine (F) are bonded together, wherein the coating layer is formed by a laser sintering process occurring by projecting the pulsed laser beam.

20 Claims, 4 Drawing Sheets

(51) Int. Cl.
*C23C 16/48* (2006.01)
*C23C 16/56* (2006.01)

(58) Field of Classification Search
CPC ............ C23C 14/5846; C23C 14/5813; C23C 14/083
See application file for complete search history.

(56) References Cited

U.S. PATENT DOCUMENTS

| | | | | |
|---|---|---|---|---|
| 2016/0273095 | A1* | 9/2016 | Lin | H01J 37/32467 |
| 2018/0327892 | A1* | 11/2018 | Wu | C23C 4/11 |
| 2022/0154325 | A1 | 5/2022 | Gunda et al. | |
| 2023/0187182 | A1 | 6/2023 | Sommers et al. | |

FOREIGN PATENT DOCUMENTS

| | | | |
|---|---|---|---|
| KR | 10-0463212 | B1 | 12/2004 |
| KR | 10-0797787 | B1 | 1/2008 |
| KR | 10-2496309 | B1 | 2/2023 |
| KR | 10-2497053 | B1 | 2/2023 |

OTHER PUBLICATIONS

Liu, Lihong, et al. "Effect of the heating rate on the spark-plasma-sintering (SPS) of transparent Y2O3 ceramics: microstructural evolution, mechanical and optical properties." Ceramics 4.1 (2021): 56-69.

Song, Je-Boem, et al. "Contamination particle behavior of aerosol deposited Y2O3 and YF3 coatings under NF3 plasma." Coatings 9.5 (2019): 310.

Song, Je-Boem, et al. "Contamination particles and plasma etching behavior of atmospheric plasma sprayed Y2O3 and YF3 coatings under NF3 plasma." Coatings 9.2 (2019): 102.

Zhu, Guodong, et al. "Corrosion and wear performance of aircraft skin after laser cleaning." Optics & Laser Technology 132 (2020): 106475.

* cited by examiner

METHOD OF DENSIFYING PLASMA-RESISTANT COATING LAYER

CROSS-REFERENCE TO RELATED APPLICATION

This U.S. non-provisional application is based on and claims priority under 35 U.S.C. § 119 to Korean Patent Application No. 10-2024-0128266, filed on Sep. 23, 2024, in the Korean Intellectual Property Office, the disclosure of which is hereby incorporated by reference herein in its entirety.

BACKGROUND

The inventive concept relates to a method of densifying a plasma-resistant coating layer. More particularly, the inventive concept relates to a method of densifying a plasma-resistant coating layer by laser sintering used in semiconductor manufacturing processes.

When components or materials are exposed to a plasma-reactive atmosphere in equipment used for semiconductor manufacturing, particularly, plasma-assisted work processes (for example, an etching process), the surfaces of the components or materials may be easily damaged, and thus, most of such components or materials are provided with coating layers resistant to plasma working environments. Various ceramic materials are used in semiconductor process equipment, and the extent of contamination particle generation or physical etching varies depending on the position in the semiconductor process equipment. Currently, $Y_2O_3$ is widely used as a plasma-resistant material with high corrosion resistance and typically manufactured using coating techniques such as physical vapor deposition (PVD), room-temperature vacuum spray (aerosol deposition), and suspension plasma spray (SPS).

Recently, yttrium oxyfluoride (YOF) and yttrium fluoride ($YF_3$) have gained attention as ceramic-coating materials for components due to their ability to inhibit chemical reaction with fluorine gases such as $CF_4$ and $NF_3$. The reason for this is that when $Y_2O_3$ coating layers of the related art are exposed to fluorine-based plasma environments, a large amount of $YF_3$ particles is observed on the surfaces of the $Y_2O_3$ coating layers. Therefore, the application of YOF and $YF_3$ coatings containing fluorine is expected to enhance plasma-resistant properties such as reducing contamination particles in fluorine-based plasma environments.

SUMMARY

The inventive concept provides a method of forming a densified plasma-resistant coating layer with high plasma resistance.

Aspects of the inventive concept are not limited thereto, and other aspects of the inventive concept will be apparently understood by those skilled in the art through the following description.

To achieve technical aspects of the inventive concept, methods of densifying a plasma-resistant coating layer are provided as follows.

According to an aspect of the inventive concept, a method of densifying a plasma-resistant coating layer includes applying a fluorocarbon material represented by Formula 2 to a surface of a base material including a surface represented by Formula 1, to form a fluorocarbon coated base material; and projecting a laser beam onto a region of the fluorocarbon coated base material to form a coating layer over the base material, in which coating layer yttrium (Y) and fluorine (F) are bonded together, wherein the coating layer is formed by a laser sintering process occurring by projecting the laser beam. [Formula 1]

$$Y_aO_b$$

where a and b are each independently a real number greater than 0, and $$C_xH_yF_z \qquad \text{[Formula 2]}$$

where x and z are each independently a real number greater than 0, and y is a real number greater than or equal to 0.

According to another aspect of the inventive concept, a method of densifying a plasma-resistant coating layer includes forming a fluorocarbon deposition layer that covers a surface of a base material including an yttrium oxide coating, irradiating the fluorocarbon deposition layer with a laser beam to destroy a fluorocarbon structure included in the fluorocarbon deposition layer, and forming a YOF coating layer on the surface of the base material from fluorine (F) generated from the destroyed fluorocarbon structure.

According to another aspect of the inventive concept, a method of densifying a plasma-resistant coating layer includes forming a fluorocarbon deposition layer that has a thickness of 1 nm or greater and entirely covers a surface of a base material, the surface of the base material including an yttrium oxide coating, irradiating the fluorocarbon deposition layer with a pulsed laser beam having an instantaneous temperature of 500° C. to 2,000° C., and forming a YOF coating layer on the surface of the base material by a fluorine material included in the fluorocarbon deposition layer reacting with an yttrium oxide material included in the surface of the base material while removing a carbon material included in the fluorocarbon deposition layer through an exhaust system, wherein the YOF coating layer entirely covers the surface of the base material, and wherein an average misorientation angle between sub-grains in an yttrium oxide coating surface included in the surface of the base material is increased after the irradiating of the fluorocarbon deposition layer with the pulsed laser beam.

Also provided are plasma-resistance coating layers produced by the methods provided herein.

Further provided are semiconductor materials coated with plasma-resistant coating layers produced by the methods provided herein.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
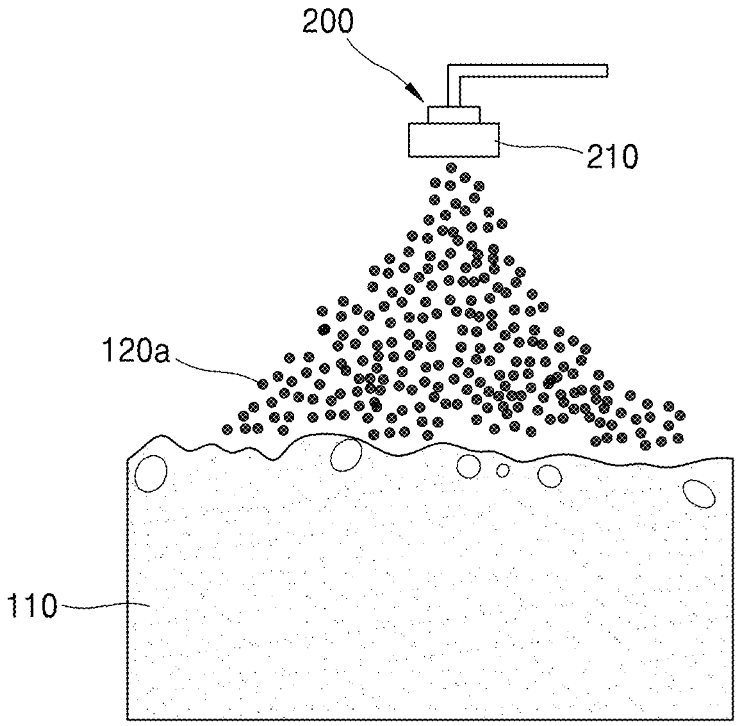
FIGS. 1 to 5 are cross-sectional views briefly illustrating processes of densifying a plasma-resistant coating layer according to embodiments.

Hereinafter, embodiments will be described with reference to the accompanying drawings. In the drawings, like reference numerals denote like elements, and repeated descriptions thereof are omitted.

Items described in the singular herein may be provided in plural, as can be seen, for example, in the drawings. Thus, the description of a single item that is provided in plural should be understood to be applicable to the remaining plurality of items unless context indicates otherwise.

It will be understood that the terms “comprises” and/or “comprising,” or “includes” and/or “including” when used in this specification, specify the presence of stated features, regions, integers, steps, operations, elements, and/or components, but do not preclude the presence or addition of one or more other features, regions, integers, steps, operations, elements, components, and/or groups thereof.

Ordinal numbers such as “first,” “second,” etc. may be used simply as labels of certain elements, steps, etc., to distinguish such elements, steps, etc. from one another. Terms that are not described using “first,” “second,” etc., in the specification, may still be referred to as “first” or “second” in a claim. In addition, a term that is referenced with a particular ordinal number (e.g., “first”) in a particular claim may be described elsewhere with a different ordinal number (e.g., “second”) in the specification or another claim.

In the chemical formulae herein, subscript variables may be used having similar letters, such as “x” or “y”, but it should be understood that the variables do not necessarily have the same value from formula to formula. The possible value of each subscript is provided with each corresponding formula.

The inventive concept may be embodied in various different forms and various embodiments, and specific embodiments are described with reference to the accompanying drawings. However, the inventive concept is not limited to the specific embodiments, and it should be understood that the idea and technical scope of the embodiments cover all the modifications, equivalents, and replacements. Detailed descriptions related to well-known functions or configurations may not be included herein, to avoid unnecessarily obscuring subject matters of the inventive concept.

FIGS. 1 to 5 are cross-sectional views briefly illustrating processes of forming a plasma-resistant coating layer on a base material surface through the application of fluorocarbon and irradiation with a laser according to embodiments.

According to an embodiment, a method of forming or densifying a plasma-resistant coating layer may include (a) applying a fluorocarbon material represented by Formula 2 below to a base material surface of an yttrium oxide coating that is represented by Formula 1 below to form a fluorocarbon coated base material, which may be formed on a semiconductor component, and (b) irradiating, with a laser beam (such as a pulsed laser beam), a region of the fluorocarbon coated base material to form a YOF coating layer on the surface of the yttrium oxide coating.

$$Y_aO_b \quad \text{[Formula 1]}$$

(where a and b are each independently a real number greater than 0)

For example, the surface of the yttrium oxide coating represented by Formula 1 may be a $Y_2O_3$ coating surface. However, the inventive concept is not limited to the $Y_2O_3$ coating surface and may also be applied to yttrium oxide-based coating surfaces having other compositions. Moreover, the inventive concept is not limited to $Y_aO_b$ coating surfaces and may also be applied to other yttrium-based coating surfaces (described below).

$$C_xH_yF_z \quad \text{[Formula 2]}$$

(where x and z are each independently a real number greater than 0, and y is a real number greater than or equal to 0)

The fluorocarbon material represented by Formula 2 may be a polymer-based material. In some embodiments, x and z may each be greater than 0, and y may be 0, and the fluorocarbon material represented by Formula 2 may be $C_xF_z$.

In some embodiments, the fluorocarbon material represented by Formula 2 may have a higher fluorine (F) content than a carbon (C) content and/or a hydrogen (H) content. For example, in some embodiments, z may be greater than x and/or y.

FIG. 1 is a cross-sectional view briefly illustrating a process of applying fluorocarbon particles **120*a* onto an yttrium oxide coating surface 110**.

Referring to FIG. 1, the fluorocarbon particles **120*a* may be applied onto the yttrium oxide coating surface 110 through a spray nozzle 210 of a spray 200**.

For simplicity of illustration, only the yttrium oxide coating surface 110 is shown in FIG. 1 (and other figures). However, the yttrium oxide coating surface 110 may be a coating surface formed on a component such as a semiconductor component. For example, the yttrium oxide coating surface 110 may be a coating surface formed on a semiconductor component. Portions that are to be exposed to internal plasma in a process chamber during a plasma dry etching process may be coated with yttrium oxide because yttrium oxide has higher etch resistance than other ceramic materials in plasma processes.

Although FIG. 1 shows that the fluorocarbon particles **120*a* are applied through the spray 200**, this is only an illustrative example, and other methods (for example, a chemical vapor deposition (CVD) method using plasma or a thermal deposition method) may also be used.

For example, when the fluorocarbon particles **120*a* are applied by a CVD method using plasma, fluorocarbon gas may be introduced into a chamber to effectively apply the fluorocarbon particles 120*a***. In example embodiments at least one gas selected from the group consisting of argon gas, nitrogen gas, and oxygen gas may be additionally introduced into the chamber for uniform and rapid deposition.

Figure 2:
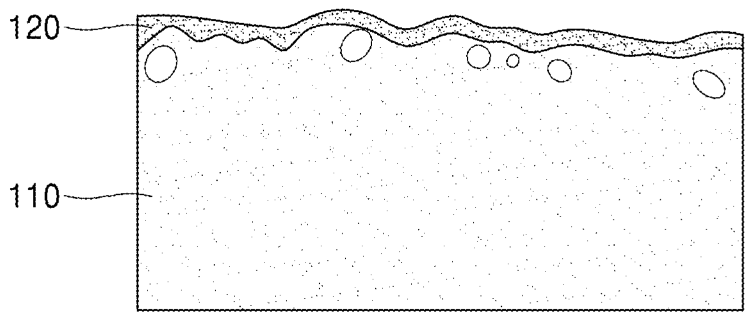

Referring to FIG. 2, a fluorocarbon deposition layer 120 may be formed on the yttrium oxide coating surface 110. The fluorocarbon deposition layer 120 may be a layer formed by applying the fluorocarbon particles **120*a* (see FIG. 1) to the entire region of the yttrium oxide coating surface 110**.

In embodiments, the fluorocarbon deposition layer 120 may have varying thicknesses across different regions. For example, in some embodiments, the fluorocarbon deposition layer 120 may be formed with a conformal thickness on the yttrium oxide coating surface 110. However, as illustrated in FIG. 2, the deposition thickness of the fluorocarbon deposition layer 120 may be greater in some regions than in other regions.

The thickness of a layer may refer to the dimension in the direction perpendicular to the surface of the layer. The direction perpendicular to the surface may refer to its average orientation and not include minor unintentional deviations that may be formed during a manufacturing process.

When the deposition thickness of the fluorocarbon deposition layer 120 varies by region, the minimum deposition thickness of the fluorocarbon deposition layer 120 may be 1 nm. For example, the thickness of the fluorocarbon deposition layer 120 may be 1 nm or greater in all regions. In example embodiments, the fluorocarbon deposition layer 120 may be 1 nm to 20 nm.

Figure 3:
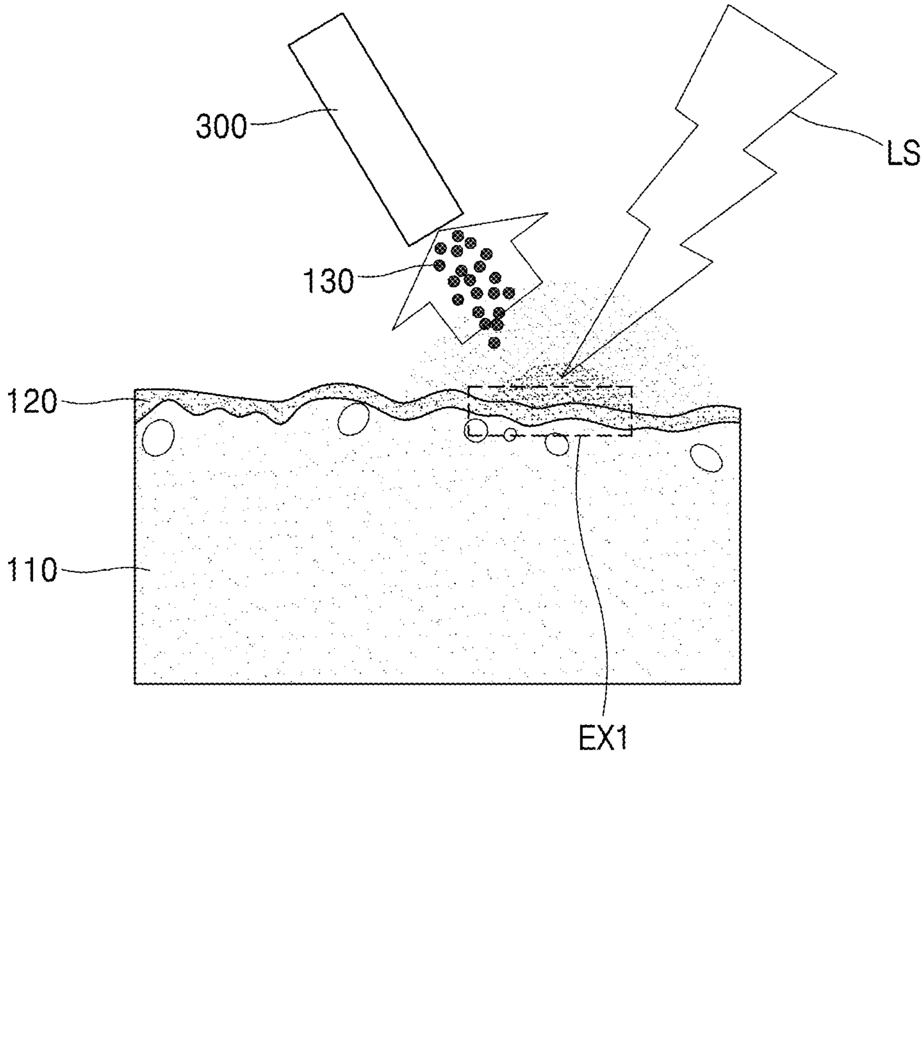
Figure 4:
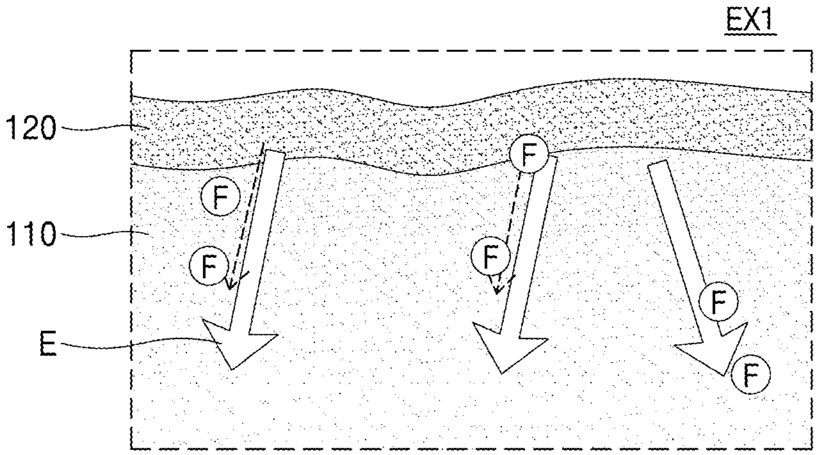

Referring to FIG. 3, the yttrium oxide coating surface 110 on which the fluorocarbon deposition layer 120 is formed may be irradiated with a laser beam LS (such as a pulsed laser beam). FIG. 4 is an enlarged partial view illustrating a portion EX1 of FIG. 3.

In embodiments, gases such as oxygen, nitrogen, argon, hydrogen, or a combination thereof may be used during the irradiation with the laser beam LS.

In embodiments in which the laser beam LS is a pulsed laser beam, the pulsed laser beam LS may be projected in nanosecond timeframes and provide an extremely high temperature and energy to the fluorocarbon deposition layer 120. The irradiation with the pulsed laser beam LS is a process of intermittently delivering a large amount of energy to the yttrium oxide coating surface 110 over a relatively short period of time. This may cause repeated melting and sintering of the yttrium oxide coating surface 110, and thus, the base material surface may have an increased average misorientation angle between sub-grains and enhanced crystallinity.

In this case, after the laser sintering, the increased misorientation angle between sub-grains of the base material surface may, for example, range from 0° to 100 or 2° to 8°.

In embodiments, the instantaneous temperature of the pulsed laser beam LS during the irradiation may be 500° C. or greater. For example, the instantaneous temperature of the pulsed laser beam LS may range from 500° C. to 2,000° C. or 750° C. to 1750° C. However, the instantaneous temperature, while sufficient to cause a reaction of a carbon material 130, is lower than the melting point of $Y_2O_3$ (approximately 4300° C. or greater) and may thus not degrade the yttrium oxide coating surface 110.

The structure and molecules of the fluorocarbon deposition layer 120 may be disrupted by the high energy of the laser beam LS, as described with reference to Chemical Equation 1 below.

[Chemical Equation 1]

$$Y_2O_3(s) + aCF_4(s,g) + bO_2 \longrightarrow YO_xF_y(s) + cCO_z(g)$$

Referring to Chemical Equation 1 together with FIGS. 3 and 4, as the laser beam LS is projected in an oxygen gas environment, $CF_4$ included in the fluorocarbon deposition layer 120 is decomposed, and a $YO_xF_y$ coating layer may be formed on the yttrium oxide coating surface 110. In $YO_xF_y$, x is a real number greater than 0 and y is a real number greater than 0.

The carbon material 130 included in the fluorocarbon deposition layer 120 may react with oxygen under high energy and may then be removed in the form of gas or particles via an exhaust system 300. While a portion of a fluorine (F) material may vaporize and be removed together with the carbon material 130, the other portion may permeate and diffuse into the yttrium oxide coating surface 110.

Energy E of the laser beam LS is delivered to the yttrium oxide coating surface 110, and referring particularly to FIG. 4, the fluorine material permeating into the yttrium oxide coating surface may react with yttrium oxide and may remain as $YO_xF_y$ in the yttrium oxide coating surface 110.

Referring to FIG. 3, the exhaust system 300 is used to remove vaporized contamination particles (for example, the carbon material 130). The exhaust system 300 may perform a blowing process using nitrogen gas or carbon dioxide gas or an ultrasonic cleaning process. The temperature of the chamber may be greater than or equal to room temperature for the removal of vaporized contamination particles.

Although FIG. 3 shows that only the carbon material 130 is removed, this is only an example, and byproducts other than the carbon material 130 may also be generated. For instance, other impurities may already be on the yttrium oxide coating surface 110 before the fluorocarbon deposition layer 120 is formed, and these impurities may be removed along with the carbon material 130. In some embodiments, materials such as aluminum (Al) and/or chlorine (Cl) may also be removed along with the carbon material 130.

Figure 5:
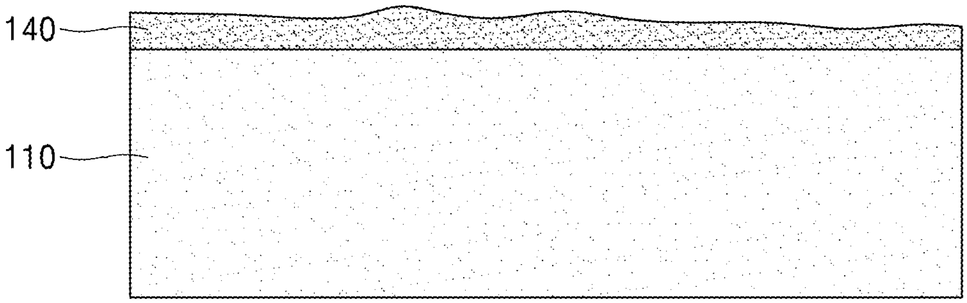

After the irradiation with the laser beam LS, the formation of $YO_xF_y$, and the removal of the carbon material 130, a YOF coating layer 140 may remain on the yttrium oxide coating surface 110, as shown in FIG. 5.

The YOF coating layer 140 remaining on the yttrium oxide coating surface 110 may have a non-conformal thickness, as shown in FIG. 5, and even in this case, the YOF coating layer 140 may entirely cover the yttrium oxide coating surface 110.

Due to the repeated melting and sintering of the yttrium oxide coating surface 110, the yttrium oxide coating surface 110 may have greater surface strength and lower porosity than before the repeated melting and sintering. For example, the yttrium oxide coating surface 110 may have some pores at the stages shown in FIGS. 1 to 3, but the yttrium oxide coating surface 110 may be dense without residual pores at the stage shown in FIG. 5.

In some embodiments, the average sub-grain size of the yttrium oxide coating surface 110 may not be greater than 0.8 μm.

A dry laser cleaning process may be performed to clean the yttrium oxide coating surface 110 without physical and/or chemical damage. Thus, during the dry laser cleaning process, the outmost layer, for example, the YOF coating layer 140, may be preserved, and the surface of the YOF coating layer 140 may be reconstructed and modified by laser energy E (such as high pulsed laser energy), thereby enhancing the plasma resistance of the YOF coating layer 140. In this case, when a dry etching process is performed, the YOF coating layer 140 may exhibit higher stability against etching reaction and a lower defect rate than the yttrium oxide coating surface 110. Therefore, implementing the YOF coating layer 140 stably may be a key point.

The inventive concept addresses the issues mentioned herein by depositing a fluorocarbon-based polymer on the yttrium oxide coating surface 110 and irradiating the yttrium oxide coating surface 110 with a laser beam LS (such as a pulsed laser beam) to remove carbon included in the fluorocarbon-based polymer through vaporization under high energy E while allowing remaining fluorine atoms to permeate and diffuse into the yttrium oxide coating surface 110 to form the YOF coating layer 140.

In addition, due to the removal of byproducts (for example, the carbon material 130) and surface restructuring by the high energy E of the laser beam LS, YOF may be formed on the yttrium oxide coating surface 110 within a short period of time, and the surface strength of the yttrium oxide coating surface 110 may be increased to improve plasma resistance and maintain process stability.

In some embodiments, although the YOF coating layer 140 is already formed on the outermost side of the yttrium oxide coating surface 110, the YOF coating layer 140 may not entirely cover the yttrium oxide coating surface 110 or may have an insufficient fluorine (F) content. In this case, a YOF coating layer forming process may be additionally performed. This situation is described below with reference to FIGS. 6 and 7.

Figure 6:
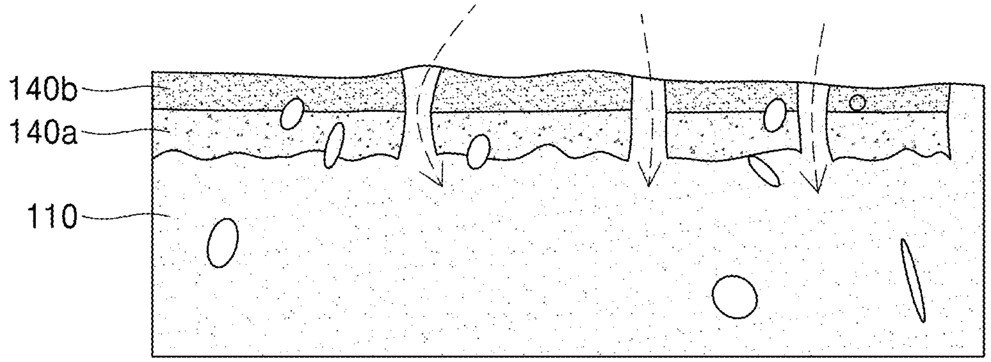
FIGS. 6 and 7 are cross-sectional views briefly illustrating processes of densifying a plasma-resistant coating layer according to other embodiments.
Figure 7:
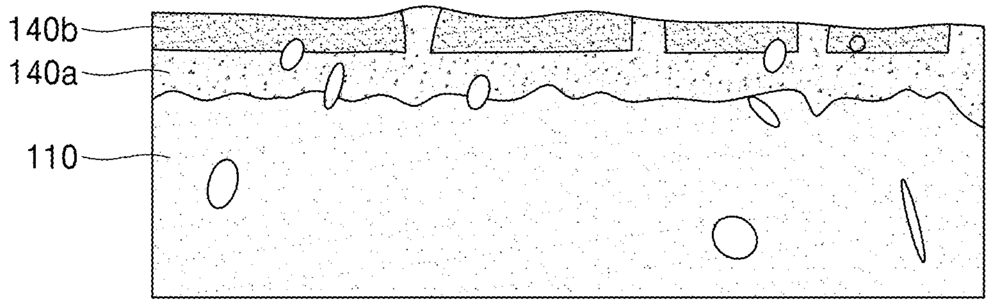

FIGS. 6 and 7 are cross-sectional views illustrating processes of forming a plasma-resistant coating layer on a base material surface through the application of fluorocarbon and irradiation with a laser according to other embodiments.

Referring to FIG. 6, a first YOF coating layer 140*a* and a second YOF coating layer 140*b* may be formed on an yttrium oxide coating surface 110. In some embodiments, the second YOF coating layer 140*b* may have a denser structure than the first YOF coating layer 140*a*.

A semiconductor component on which a YOF structure is not formed or of which the use time is not sufficiently long may have an incomplete YOF coating layer (such as the first and second YOF coating layers 140*a* and 140*b*) formed on the yttrium oxide coating surface 110, as shown in FIG. 6. In such cases, various impurities may permeate through pores of the incomplete YOF coating layer (such as the first and second YOF coating layers 140*a* and 140*b*), and thus, a dry laser cleaning process may have a negative effect on the reliability of the semiconductor component. Thus, in example embodiments, there may be an additional plasma seasoning time. In the present specification, the term "plasma seasoning time" may refer to the duration for a component coated with an yttrium oxide material to form a YOF layer on the surface of a coated portion through prolonged exposure to fluorine-based plasma. The longer the plasma seasoning time of a process, the lower the productivity of the process.

A fluorocarbon-based polymer may be applied to a structure shown in FIG. 6, and a laser beam may be projected onto the structure to form an additional YOF coating layer (see FIGS. 1 to 5). Then, as shown in FIG. 7, the first and second YOF coating layers 140*a* and 140*b* respectively, may cover the yttrium oxide coating surface 110. In example embodiments the first and second YOF coating layers may entirely cover the yttrium oxide coating surface.

Although the yttrium oxide coating surface 110 may primarily include $Y_2O_3$, the inventive concept is not limited thereto. The yttrium oxide coating surface 110 may include at least one coating material selected from the group consisting of YOF, $YF_3$, and yttrium-aluminum garnet (YAG). For example, an yttrium-based coating material may be included in the yttrium oxide coating surface 110. In addition, the YOF coating layer 140 is not limited to including only a YOF material but may additionally include another material in which yttrium and fluorine bond together (for example, $YF_x$, where x is a real number greater than 0).

In addition, although embodiments are provided in which the fluorocarbon deposition layer 120 is first formed, and then, a laser beam LS (such as a pulsed laser beam) is projected onto the fluorocarbon deposition layer 120, these processes may be simultaneously performed. For example, the YOF coating layer 140 may be formed by projecting a laser beam LS in a gas environment containing fluorine (F).

In the present specification, the term "gas environment containing fluorine (F)" may refer to a gas environment containing fluorine (F) as well as $F_2$. For example, the gas environment containing fluorine (F) may be a gas environment including a gas selected from the group consisting of $CF_4$, $CHF_3$, $NF_3$, or a combination thereof. When a laser beam LS is projected in the gas environment containing fluorine (F) gas, at least one gas selected from argon gas, helium gas, nitrogen gas, oxygen gas, or hydrogen gas may be additionally included in the gas environment containing fluorine (F).

In contrast, when a fluorocarbon application process and a laser irradiation process are sequentially performed as described with reference to FIGS. 1 to 7, a laser beam LS (such as a pulsed laser beam) may be projected in a room-temperature and atmospheric-pressure environment, a vacuum environment, or an environment containing at least one gas selected from argon gas, helium gas, or nitrogen gas.

While the inventive concept has been particularly shown and described with reference to embodiments thereof, it will be understood that various changes in form and details may be made therein without departing from the spirit and scope of the following claims.

What is claimed is:

1. A method of densifying a plasma-resistant coating layer, the method comprising:

applying a fluorocarbon material represented by Formula 2 to a surface of a base material comprising a surface represented by Formula 1 to form a fluorocarbon coated base material; and projecting laser beam onto a region of the fluorocarbon coated base material, to form a coating layer over the base material, in which coating layer yttrium (Y) and fluorine (F) are bonded together, wherein the coating layer is formed by a laser sintering process occurring by projecting the laser beam,

[Formula 1]

$$Y_aO_b$$

where a and b are each independently a real number greater than 0,

[Formula 2]

$$C_xH_yF_z$$

where x and z are each independently a real number greater than 0, and y is a real number greater than or equal to 0.

2. The method of claim 1, wherein the coating layer over the base material entirely covers the surface of the base material.

3. The method of claim 1, wherein the fluorocarbon material applied to the surface of the base material has a thickness of 1 nm or more.

4. The method of claim 1, wherein, the laser beam is a pulsed laser beam and when the pulsed laser beam is projected, the pulsed laser beam has an instantaneous temperature of 500° C. to 2,000° C.

5. The method of claim 1, wherein energy generated by the laser beam reaches the surface of the base material through the region of the base material to which the fluorocarbon material is applied.

6. The method of claim 1, wherein, when the laser beam is projected, a carbon material included in the fluorocarbon material forms a restructured carbon material in a gaseous state or a particle state.

7. The method of claim 6, wherein the restructured carbon material is removed through an exhaust system.

8. The method of claim 1, wherein the surface of the base material comprises $Y_2O_3$, and the coating layer over the base material comprises YOF.

9. The method of claim 1, wherein the applying of the fluorocarbon material is performed through at least one process selected from the group consisting of a chemical vapor deposition (CVD) process using plasma, an application process using a spray, and a thermal deposition process.

10. The method of claim 1, further comprising removing byproducts generated during the laser sintering process by performing a blowing process using nitrogen gas or carbon dioxide gas, or by an ultrasonic cleaning process.

11. The method of claim 1, wherein an average misorientation angle between sub-grains in an yttrium oxide coating surface included in the surface of the base material is greater after the laser sintering process than before the laser sintering process.

12. The method of claim 11, wherein the sub-grains in the yttrium oxide coating surface included in the surface of the base material have an average size not greater than 0.8 μm after the laser sintering process.

13. A method of densifying a plasma-resistant coating layer, the method comprising:

forming a fluorocarbon deposition layer that covers a surface of a base material comprising an yttrium oxide coating;

irradiating the fluorocarbon deposition layer with a laser beam to destroy a fluorocarbon structure included in the fluorocarbon deposition layer; and forming a YOF coating layer on the surface of the base material from fluorine (F) generated from the destroyed fluorocarbon structure.

14. The method of claim 13, wherein the irradiating of the fluorocarbon deposition layer with the laser beam is performed in a gas environment comprising at least one gas selected from the group consisting of $CF_4$, $CHF_3$, $NF_3$, and F.

15. The method of claim 14, wherein the gas environment comprising at least one gas selected from the group consisting of $CF_4$, $CHF_3$, $NF_3$, and F, further comprises at least one gas selected from the group consisting of argon gas, helium gas, nitrogen gas, oxygen gas, hydrogen gas, and combinations thereof.

16. The method of claim 14, wherein the irradiating of the fluorocarbon deposition layer with the laser beam is performed simultaneously with the forming of the YOF coating layer.

17. The method of claim 13, wherein the YOF coating layer entirely covers the surface of the base material.

18. The method of claim 13, wherein an average misorientation angle between sub-grains in a surface of an yttrium oxide material, which is included in the surface of the base material after the YOF coating layer is formed is greater after a laser sintering process than before the laser sintering process.

19. The method of claim 13, wherein carbon generated from the destroyed fluorocarbon structure is removed through an exhaust system.

20. A method of densifying a plasma-resistant coating layer, the method comprising:

forming a fluorocarbon deposition layer that has a thickness of 1 nm or greater and entirely covers a surface of a base material, the surface of the base material comprising an yttrium oxide coating;

irradiating the fluorocarbon deposition layer with a pulsed laser beam having an instantaneous temperature of 500° C. to 2,000° C.; and forming a YOF coating layer on the surface of the base material by fluorine material included in the fluorocarbon deposition layer reacting with an yttrium oxide material included in the surface of the base material while removing a carbon material included in the fluorocarbon deposition layer through an exhaust system, wherein the YOF coating layer entirely covers the surface of the base material, and wherein an average misorientation angle between sub-grains in a surface of the yttrium oxide material, which is included in the surface of the base material before and after the irradiating of the fluorocarbon deposition layer with the pulsed laser beam, is increased after the irradiating of the fluorocarbon deposition layer with the pulsed laser beam than before irradiating the fluorocarbon deposition layer.

* * * * *